United States Patent
Yuang et al.

(10) Patent No.: US 6,483,864 B1
(45) Date of Patent: Nov. 19, 2002

(54) PARTIAL REFLECTIVE LASER OUTPUT DEVICE

(75) Inventors: Rong-Heng Yuang, Hsinchu (TW); Chia-Ming Tsai, Hsinchu (TW); Ding-Wei Huang, Taipei (TW); Mu-Tao Chu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/556,901

(22) Filed: Apr. 20, 2000

(30) Foreign Application Priority Data

Mar. 7, 2000 (TW) .......................................... 89104014 A

(51) Int. Cl.[7] .............................. H01S 5/00; H01S 3/08
(52) U.S. Cl. .............................. 372/96; 372/92; 372/50; 372/94; 372/101; 372/43
(58) Field of Search .............................. 372/43, 50, 36, 372/92, 96, 99, 29.011, 38.01, 101; 385/88

(56) References Cited

U.S. PATENT DOCUMENTS 5,774,614 A * 6/1998 Galliland et al. ............. 385/88
5,812,582 A * 9/1998 Galliland et al. ............. 372/50

* cited by examiner

Primary Examiner—Paul Ip
Assistant Examiner—Armando Rodriguez
(74) Attorney, Agent, or Firm—W. Wayne Liauh

(57) ABSTRACT

A partial reflective laser output device comprising a partial reflective unit mounted on a laser output device (such as a vertical cavity emitting laser), the partial reflective unit allowing the laser beam emitted from the laser output device to be partially reflected while the rest penetrating through. On one hand, this device decreases the intensity of output laser light so as to comply with the eye safety standard; the reflected light is absorbed by a photodiode (PD) to perform auto power control on the laser output device on the other. In addition, by adjusting the tilting angle of the partial reflective unit or making a curvature thereon, the reflected light can have no destructive interference with the output light and can even be focused onto the PD so that there would be no relative intensity noise problem and the size of the PD can be made smaller to lower the cost.

11 Claims, 6 Drawing Sheets

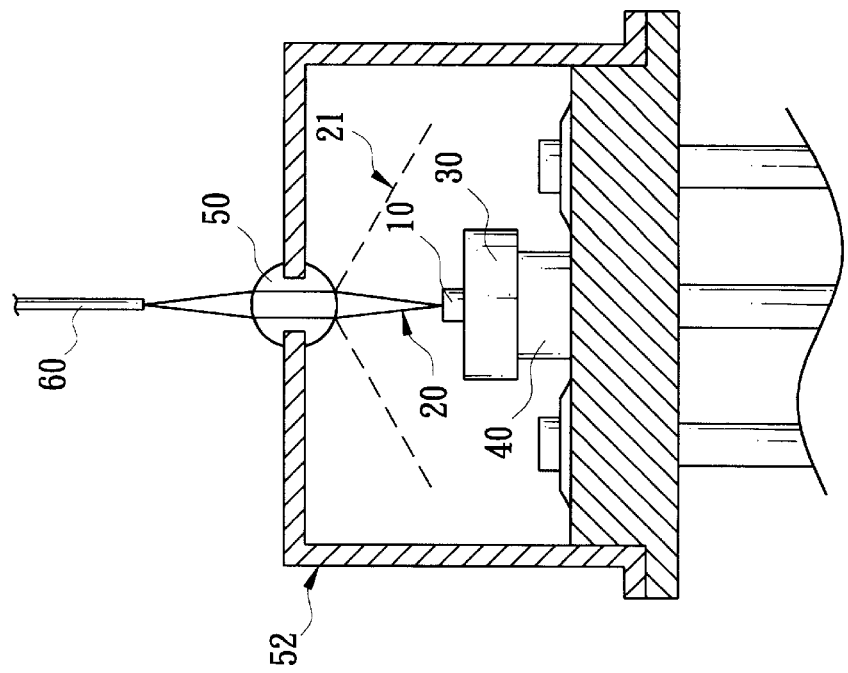
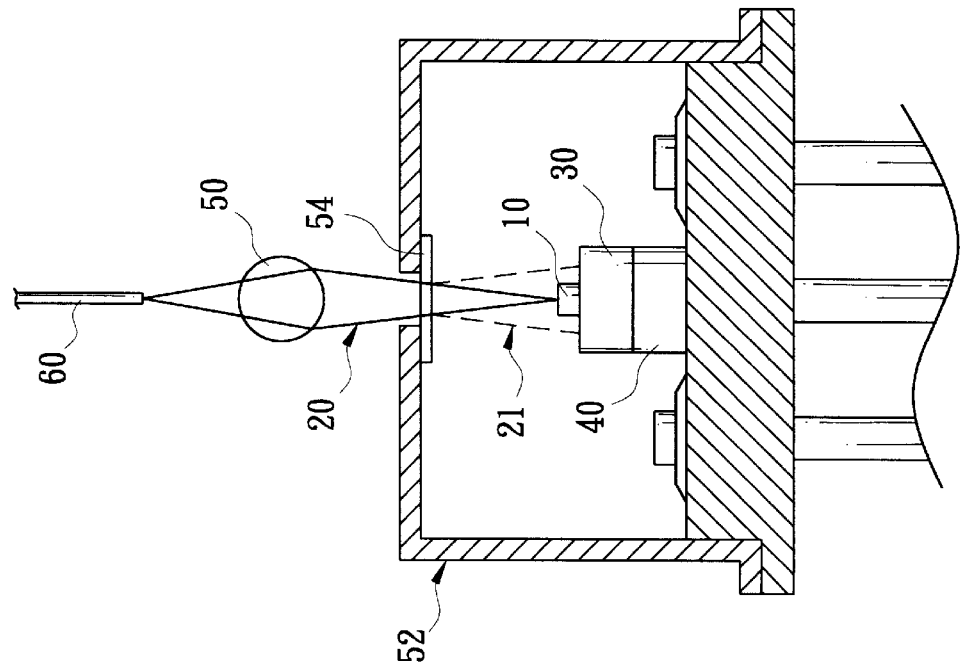
FIG. 2A (PRIOR ART)
FIG. 2B (PRIOR ART)

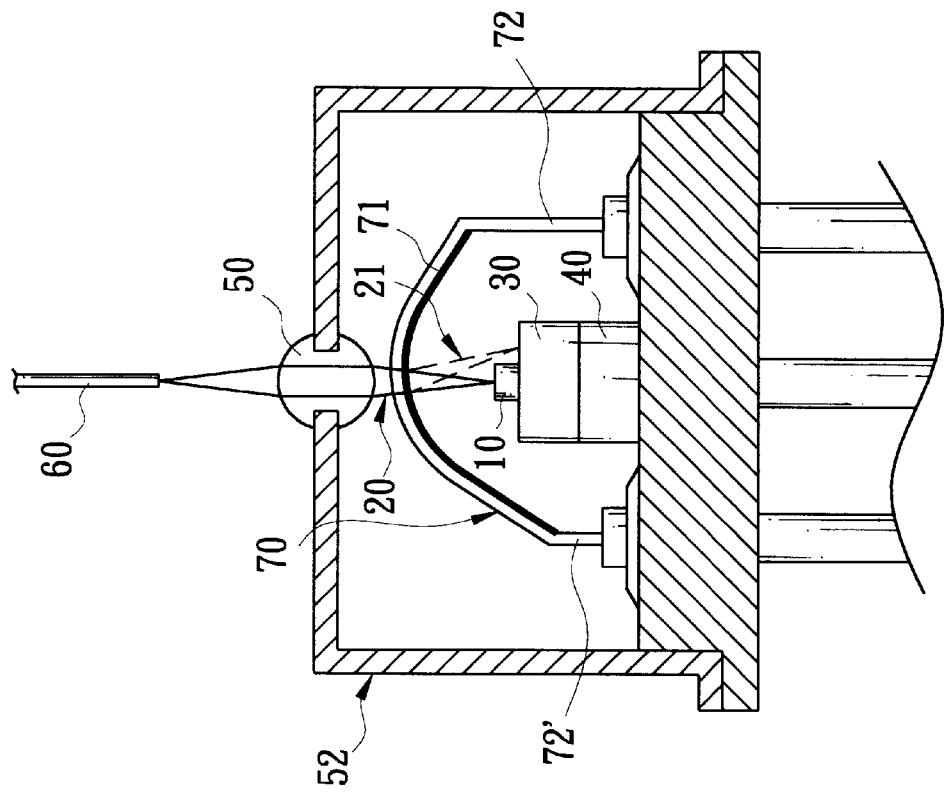
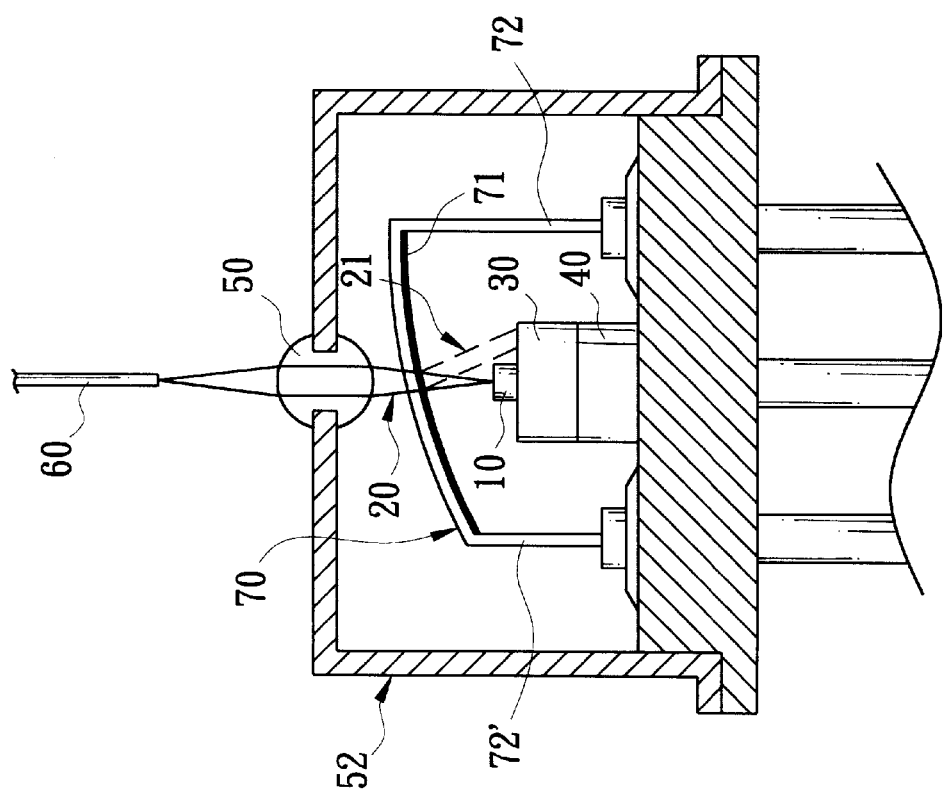

PARTIAL REFLECTIVE LASER OUTPUT DEVICE

BACKGROUND OF THE INVENTION

1. Field of Invention

The present invention relates to a partial reflective laser output device. More particularly, the present invention relates to a device with which the laser output power can be controlled to meet eye safety standards and, at the same time, the reflected light is received by a photodiode for a feedback circuit to perform auto power control. The partial reflective laser output device of the present invention can avoid the problem of relative intensity noise and is most suitable for mass production.

2. Related Art

Referring to FIG. 1, the conventional surface emitting laser output device, such as a vertical cavity surface emitting laser (VCSEL) 10 comprises a P-type mirror 11 and an N-type mirror 13 enclosing an active area 12. Resonant light in the active area 12 forms laser light, wherein the up-going light 20 is output through the surface in a cone shape, while the down-going light is absorbed by a substrate 14. Only one surface of the VCSEL 10 emits light; therefore, auto power control on this system is not so easy as an edge emitting laser which emits light on both sides. Many suggestions have been proposed in the past, and most of them call for the monitoring with detectors of epitaxial chip structures grown from monoliths around the VCSEL 10. However, most of these suggestions, which do not allow a planar structure on the VCSEL 10, would cause the product yield and reliability to be adversely affected, as well as problems in the mass production thereof.

Therefore, if one wants to monitor the output light 20 intensity without changing the CSEL 10 structure, the output light 20 from the VCSEL 10 has to be partially directed to photodiode (PD). Most methods used on currently available products on the market are add a silicon (Si) PD under the VCSEL 10 and to encapsulate the devices in a transistor outline (TO) can. The above method for monitoring the output light intensity from the VCSEL 10 is the simplest one and can be achieved by coating a layer of reflective film on the lens of the TO can. On one hand, this makes the output light 20 from the VCSEL 10 comply with the Class I Eye Safety requirement of the range between 200 µW and 400 µW, and sufficient reflected light can be fed back to the PD to perform auto power control on the other. This method does not only keep a planar structure for the VCSEL 10 but still uses surface mount technology (SMT) in encapsulation. So it is very suitable for mass production processes.

With reference to FIG. 2A and taking a conventional flat window TO can encapsulation as an example, to monitor the output light 20 intensity from the TO can encapsulated VCSEL 10 the surface of the flat window 54 can be coated with a film so that reflected light 21 generated thereby can be absorbed by the PD 30 so as to monitor the output light 20 intensity. Under this encapsulation structure, however, an additional focusing lens, such as a ball lens 50, is needed in the exterior for coupling the VCSEL 10 output light 20 into a fiber 60. Thus, calibration of light paths becomes more difficult.

To decrease the complexity of coupling light, one can consider the encapsulation with a ball lens 50 TO can 52 structure, as shown in FIG. 2B, which integrates the ball lens 50 and the TO can 52 so that calibration of the coupling light paths between the VCSEL 10 output light 20 and the fiber 60 becomes much easier. Nonetheless, this results in another problem: since light is reflected by the spherical surface of the ball lens 50, the reflection angle is so large that only a small portion of reflected light reaches and is absorbed by the PD 30. So the light current detected by the PD 30 might not be enough for the enacting threshold required by the feedback circuit. Of course, the area of the PD 30 can be enlarged to receive sufficient light, yet this increases the cost.

Moreover, it is very difficult to coat a film on the ball lens 50 by mass production and, yet, the reflected light 21 would shine on the VCSEL 10 in the above-mentioned two encapsulation structures and causes the problem of relative intensity noise.

SUMMARY OF THE INVENTION

In view of the foregoing, it is an object of the present invention to provide a convenient device to monitor and adjust the output light intensity from a laser output device, e.g. a vertical cavity surface emitting laser (VCSEL), so as to meet the eye safety standard on one hand, and to avoid the problem of relative intensity noise due to light path overlapping on the other. Furthermore, this device requires a lower manufacturing cost.

Pursuant to the above object, a partial reflective laser output device of the present invention comprises a partial reflective unit mounted on a laser output device (such as a VCSEL), the partial reflective unit allowing the laser beam emitted from the laser output device to be partially reflected while the rest penetrating through. This device decreases the intensity of output laser light to comply with the eye safety standard on one hand; the reflected light is guided to be absorbed by a photodiode (PD) for performing auto power control on the laser output device on the other. In addition, by adjusting the tilting angle of the partial reflective unit so that it is not perpendicular to the output laser light path or making a proper curvature thereon, the-reflected light can have no destructive interference with the output light and even can be focused onto the PD so that there would be no relative intensity noise problem and the size of the PD can be made smaller to lower the cost.

Moreover, the present invention can be incorporated into a transistor outline (TO) can encapsulation or be mounted on a printed circuit board for practical uses in manufacture.

These and additional objects and advantages, as well as other embodiments of the invention, will be more readily understood after a consideration of the drawings and the detailed description of the preferred embodiments.

BRIEF DESCRIPTION OF THE DRAWINGS

FIG. 2A is a first TO can encapsulation of a VCSEL in the prior art;

FIG. 2B is a second TO can encapsulation of a VCSEL in the prior art;

FIG. 4C shows a third embodiment of the present invention incorporated with TO can encapsulation; and FIG. 4D shows a fourth embodiment of the present invention incorporated with TO can encapsulation.

DETAILED DESCRIPTION OF THE INVENTION

Figure 1:
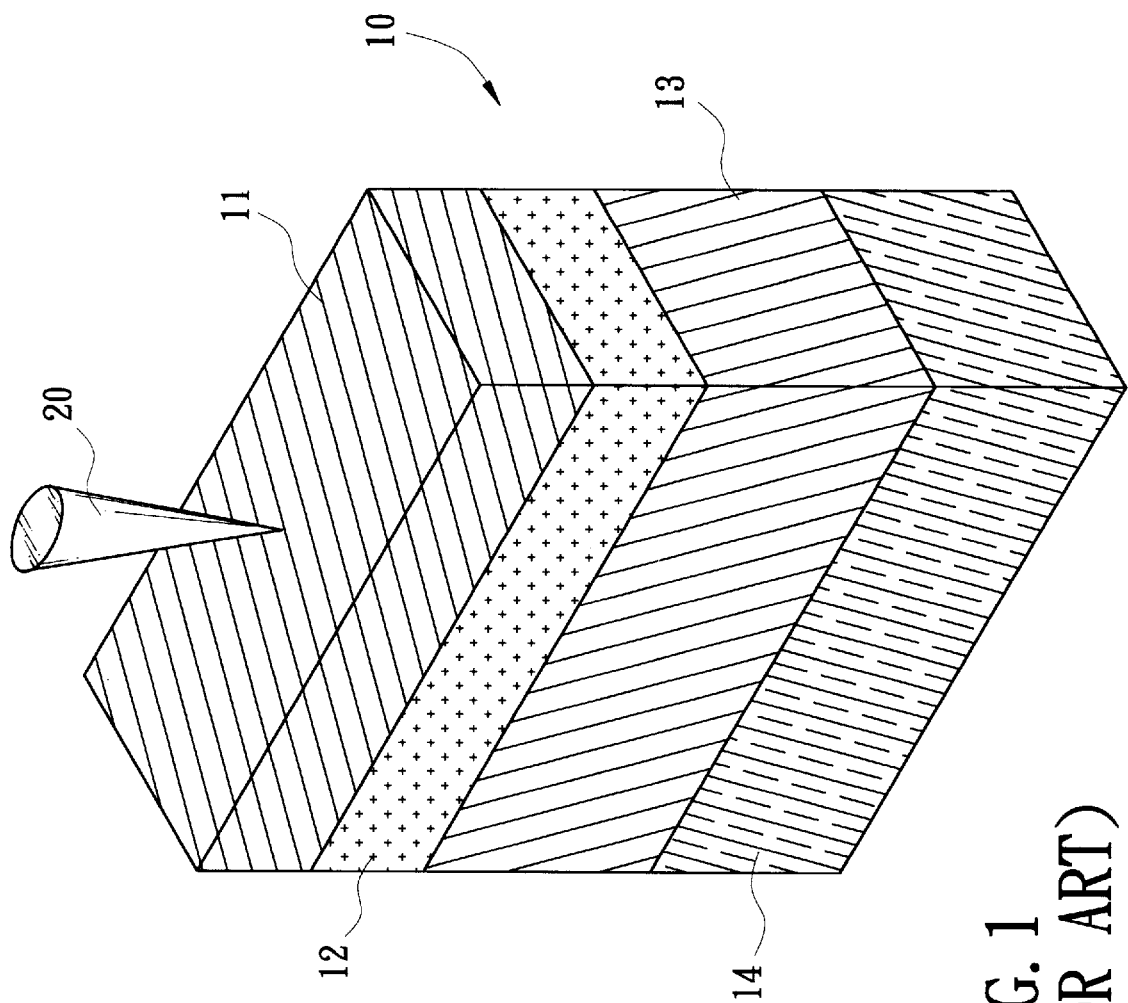
FIG. 1 is a schematic view of a VCSEL in the prior art.
Figures 3A, 3B:
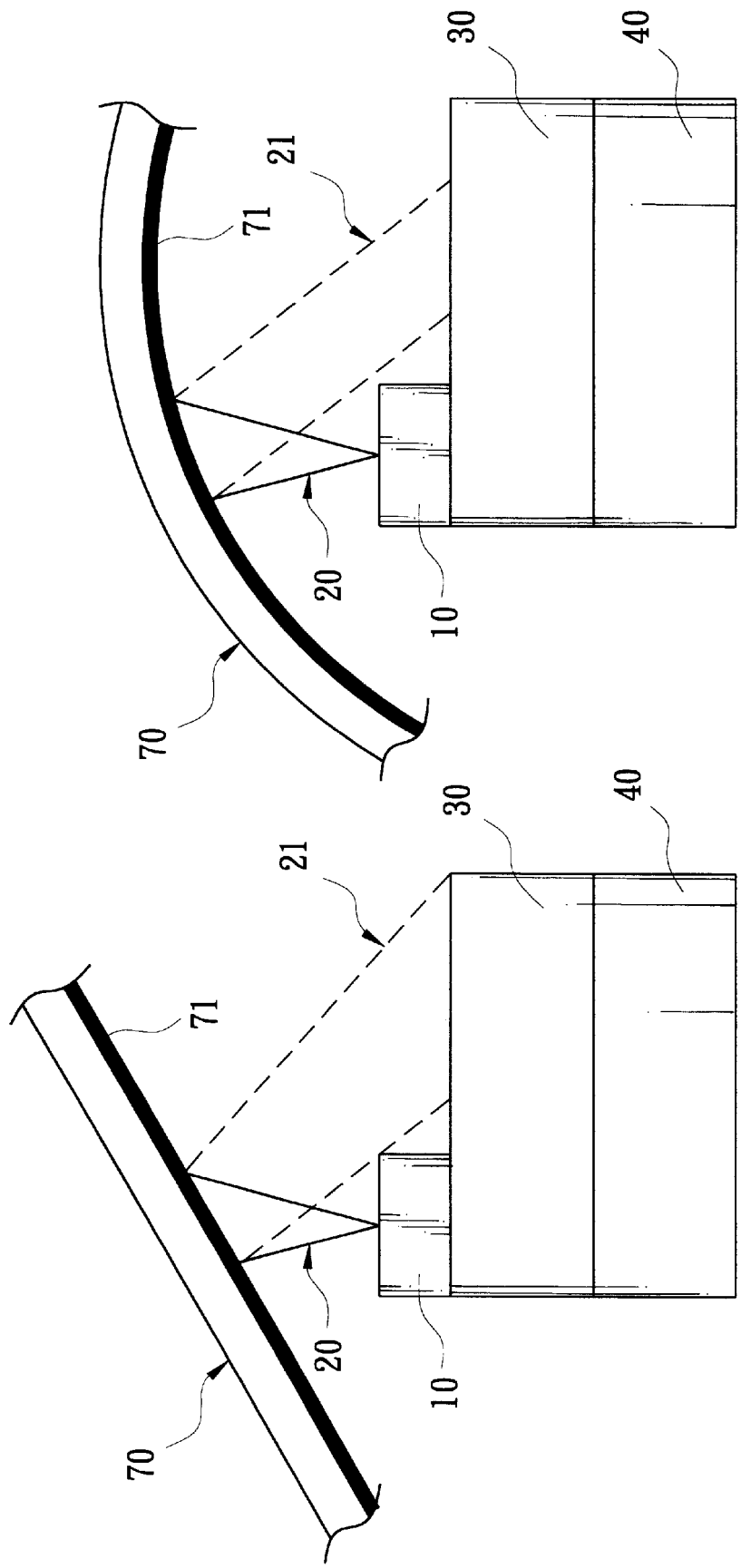
FIG. 3A shows a first embodiment of the present invention.
FIG. 3B shows a second embodiment of the present invention.

With reference to FIG. 3A, which is a first embodiment of the present invention, a laser output device is mounted on a photodiode (PD) 30 with a possible submount 40 supported therebelow. The laser output device used in this preferred embodiment is a vertical cavity surface emitting laser (VCSEL) 10, which emits a laser output beam 20 from a surface thereon. To perform auto power control on the VCSEL 10, the output beam 20 has to be partially reflected and reflected light 21 can be detected by the PD 30. Therefore, a partial reflective unit 70 with a layer of reflective film 71 coated thereon is provided on top of the VCSEL 10 for partially reflecting the output light 20. Moreover, to avoid the problem of relative intensity noise due to shining the reflected light 21 on the VCSEL 10, the partial effective unit 70 can be tilted by a proper angle so that the path of the reflected light 21 is separated from that of the output light 20. The relative positions of the VCSEL 10 and the PD 30 can also be adjusted so that the reflected light 21 is completely received by the PD 30.

Figure 3C:
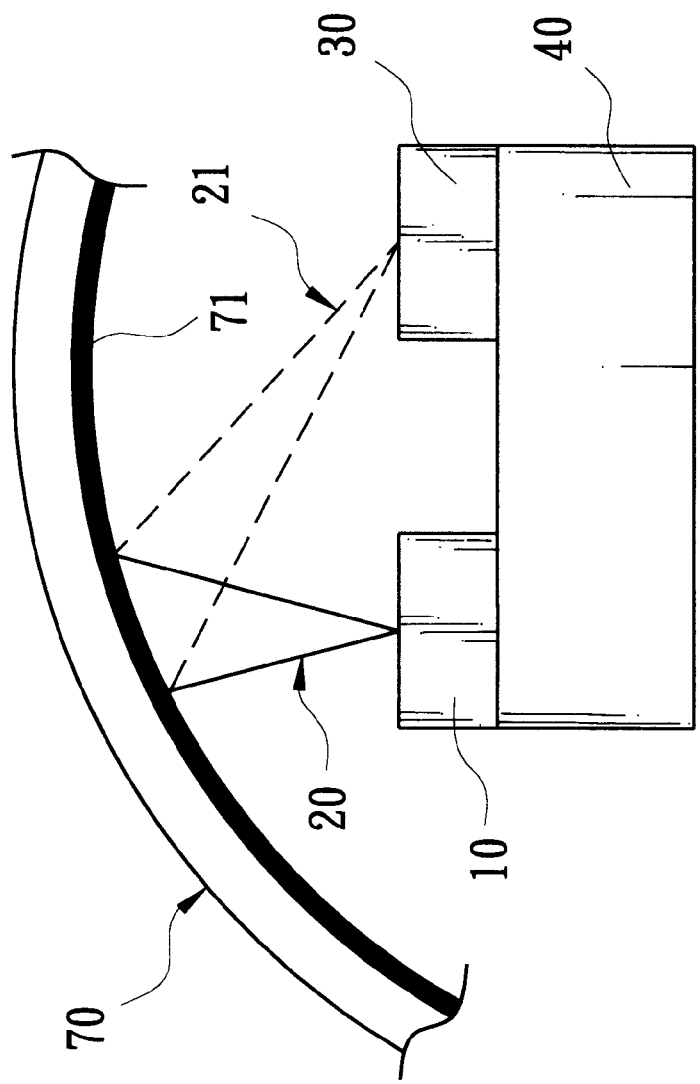
FIG. 3C shows a third embodiment of the present invention.

Please refer to FIG. 3B, which is a second embodiment of the present invention. As shown in the drawing, the partial reflective unit 70 can be made to have a curved surface which can converge the reflected light 21, whereas the previous first embodiment has divergent reflected light. As required, the design of the curved surface has to be such that the reflected light 21 can avoid reaching the VCSEL 10 and be completely absorbed by the PD 30. If the partial reflective unit 70 is manufactured to have a curved surface with a greater convergent power, as in FIG. 3C, the reflected light 21 can be focused to a smaller point. Therefore, in a third embodiment of the present invention, the PD 30 can have a smaller size and be put on one side of the VCSEL 10 that is on the reflected light 21 path.

In the above embodiments of the invention, by mounting a partial reflective unit 70 and tilting it by an angle or giving it a proper curvature, the relative intensity noise problem in conventional devices can be resolved. Since the partial reflective unit 70 can be manufactured using injection molded plastic, the method is simple and costs less. The size of the PD 30 can even be minimized. Thus, the present invention lowers the cost and is suitable for mass production.

Figure 4A:
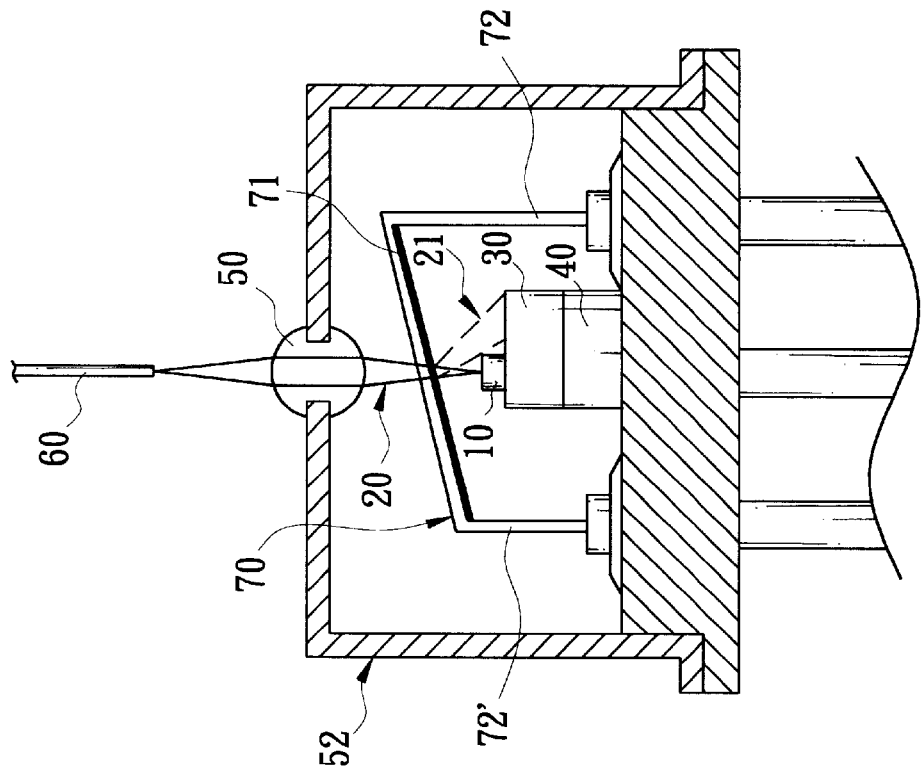
FIG. 4A shows a first embodiment of the present invention incorporated with TO can encapsulation.

In FIG. 4A, a first embodiment of the present invention incorporated with the TO can encapsulation is achieved by encapsulating a VCSEL 10 into a structure of a ball lens 50 and a TO can 52. A photodiode (PD) 30 for monitoring light intensity is integrated under the VCSEL 10. A submount 40 can be utilized to support the VCSEL 10 and the PD 30 higher. In addition, a partial reflective unit 70 is inserted between the VCSEL 10 and the ball lens 50 for partially reflecting the laser output light 20 from the VCSEL 10. The reflected light 21 is absorbed by the PD 30 to monitor the output light 20 intensity from the VCSEL 10. Likewise, the partial reflective unit 70 can be made by injection molded plastic, with a first support 72 and a second support 72' formed on both sides at the same time. The partial reflective unit 70 is then mounted on the VCSEL 10 with the first support 72 and the second support 72'. A layer of reflective film is further coated onto the surface of the partial reflective unit 70 for partially reflecting the laser output light 20. The manufacturing method is fairly simple compared to the prior art.

Therefore, the basic structure of the present invention requires a much simpler manufacturing process and keeps one advantage of the conventional encapsulation with a structure of a ball lens 50 and a TO can 52, namely, it is easier to perform calibration for the coupling light path between the output light 20 from the VCSEL 10 and a fiber 60. It also solves the problem of a larger reflection angle caused by a spherical reflection surface in the prior art.

Figure 4B:
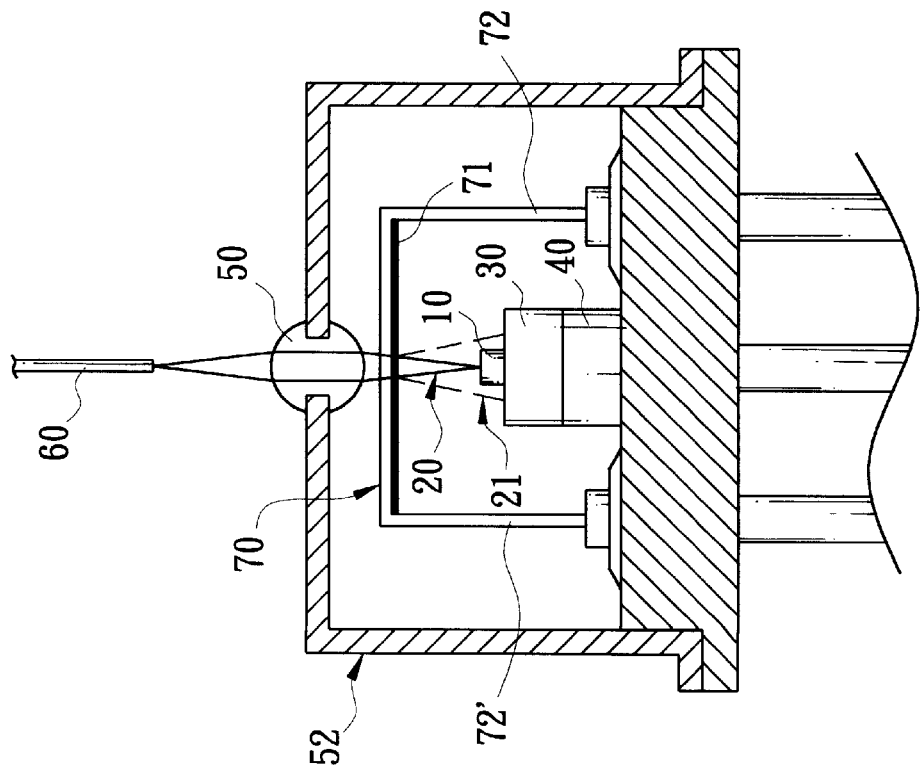
FIG. 4B shows a second embodiment of the present invention incorporated with TO can encapsulation.

However, if the partial reflective unit 70 is configured to be perpendicular to the output light 20 path, as shown in FIG. 4A, part of the reflected light 21 may travel back to the VCSEL 10 and produce interference and noise, and the reflected light 21 can not be totally absorbed by the PD 30. Thus, in a second embodiment of the present invention shown in FIG. 4B, the partial reflective unit 70 is tilted by an angle to prevent the reflected light 21 by the partial reflective unit 70 from entering the VCSEL 10. So the partial reflective unit 70 is not perpendicular to the output light 20 path, and all the reflected light 21 can enter the PD 30. The relative positions of the VCSEL 10 and the PD 30 have to be adjusted so that the PD 30 is on the light path of the reflected light 2 1.

Moreover, the partial reflective unit 70 can be designed to have a curved surface, such as the ones shown in FIGS. 4C and 4D, so long as the curved surface can focus the reflected light 21, and the focusing strength can be designed according to practical needs. Since the reflected light 21 has been focused into a smaller beam, only a PD 30 with a smaller area is needed for monitoring if the relative positions are correct during encapsulation. The advantages are that the efficiency of the PD 30 per unit area is raised and the cost is lowered.

All devices in the present invention can be made plan. The manufacturing process is simple and the encapsulation still utilizes surface mount technology (SMT), which is easy in assembling. Thus, mass production can be made at a lower cost.

The technology disclosed in the present invention aims at preventing the problem of relative intensity noise and mass production at a lower cost. Therefore, it has the following advantages:

1. The present invention maintains the planar structure of the VCSEL and increases its yield.

2. A suitable partial reflective unit meeting the requirements of the eye safety standard can be made according to the output characteristics of the VCSEL, for example, Class 1 Eye Safety demands the output light intensity between 200 $\mu$W and 400 $\mu$W.

3. The reflected light path is different from the output light path. Thus, there is no Fabry-Perot reflection effect as in the prior art and interfering noises can be lowered.

4. A silicon (Si) PD can be employed to increase the efficiency per unit area and to lower the cost.

While the present invention has been disclosed in reference to the preferred embodiments, it shall be understood by those skilled in the art that various changes, modifications and substitutions may be incorporated into such embodiments without departing from the spirit of the invention as defined by the claims appearing hereinafter.

What is claimed is:

1. A partial reflective laser output device, comprising:
   a transistor outline (TO) can;
   a laser output device encapsulated in the transistor outline can for generating a laser output light;

a ball lens placed through a top side of the transistor outline can and along a path traveled by the laser output light;

a partial reflective unit formed on top of the laser output device but is spaced apart and encapsulated inside the transistor outline can for partially reflecting the laser output light according to a reflected light path, wherein the partial reflective unit is structured so that it prevents the reflected light path from overlapping with the output light path; and a photodiode (PD) on the reflected light path for detecting the reflected light intensity.

2. The partial reflective laser output device according to claim 1, wherein the laser output device is a vertical cavity surface emitting laser (VCSEL).

3. The partial reflective laser output device according to claim 1, wherein the partial reflective unit has a flat surface and is tilted by an angle such that the partial reflective unit is not perpendicular to the laser output light path in order to achieve the goal of preventing the reflected light path from overlapping with the output light path.

4. The partial reflective laser output device according to claim 1, wherein the partial reflective unit has a curved surface with a curvature properly adjusted so that the reflected light path does not overlap with the output light path.

5. The partial reflective laser output device according to claim 1, wherein the partial reflective unit is made of plastic.

6. The partial reflective laser output device according to claim 1, wherein a layer of reflective film is further coated on one surface of the partial reflective unit so as to partially reflect the laser output light.

7. The partial reflective laser output device according to claim 1, wherein the PD is mounted under the laser output device.

8. The partial reflective laser output device according to claim 1, wherein the PD is disposed by the laser output device.

9. The partial reflective laser output device according to claim 1, wherein the laser output device, the partial reflective unit and the PD is mounted on the same surface as the laser output device.

10. The partial reflective laser output device according to claim 1, wherein a submount is provided inside the transistor outline can for supporting and elevating the height of the PD and the laser output device higher.

11. The partial reflective laser output device according to claim 1, wherein the partial reflective unit is mounted on the laser output device using two supports.

* * * * *